United States Patent
Katoch et al.

(10) Patent No.: US 12,315,552 B2
(45) Date of Patent: May 27, 2025

(54) WORD LINE DELAY INTERLOCK CIRCUIT FOR WRITE OPERATION

(71) Applicant: Taiwan Semiconductor Manufacturing Company, Ltd., Hsinchu (TW)

(72) Inventors: Atul Katoch, Kanata (CA); Sergiy Romanovskyy, Ottawa (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 121 days.

(21) Appl. No.: 18/158,489

(22) Filed: Jan. 24, 2023

(65) Prior Publication Data

US 2023/0335178 A1    Oct. 19, 2023

Related U.S. Application Data

(60) Provisional application No. 63/407,229, filed on Sep. 16, 2022, provisional application No. 63/345,227, filed on May 24, 2022, provisional application No. 63/363,176, filed on Apr. 18, 2022.

(51) Int. Cl.
*G11C 11/4076* (2006.01)
*G11C 11/408* (2006.01)
*G11C 11/4096* (2006.01)

(52) U.S. Cl.
CPC ...... *G11C 11/4076* (2013.01); *G11C 11/4085* (2013.01); *G11C 11/4096* (2013.01)

(58) Field of Classification Search
CPC ............ G11C 11/4076; G11C 11/4085; G11C 11/4096
See application file for complete search history.

(56) References Cited

U.S. PATENT DOCUMENTS

| | | | |
|---|---|---|---|
| 2004/0114411 A1* | 6/2004 | Noda | G11C 15/043 365/49.17 |
| 2011/0051502 A1 | 3/2011 | Rao et al. | |
| 2014/0036608 A1* | 2/2014 | Chiu | G11C 11/4099 365/194 |

(Continued)

OTHER PUBLICATIONS

Korean Office Action; Application No., 10-2023-0048729; Dated Apr. 17, 2024.

(Continued)

*Primary Examiner* — Min Huang
(74) *Attorney, Agent, or Firm* — Jones Day

(57) ABSTRACT

Systems, methods, and devices are described herein for a word line interlock circuit. A device includes a first logic gate, an interlock circuit, and a delay circuit. The first logic gate is configured to receive a reset signal. The interlock circuit is coupled to an output of the first logic gate and is configured to generate a first signal and selectively operate the first logic gate. The delay circuit is coupled to an output of the interlock circuit and is configured to receive the first signal from the interlock circuit and delay the first signal to generate a clock pulse width signal that is fed back to the interlock circuit. In response to the reset signal changing logic states, the selective operation of the first logic gate prevents changing edges of the reset signal from being transmitted to the delay circuit.

20 Claims, 7 Drawing Sheets

(56) References Cited

U.S. PATENT DOCUMENTS

2017/0288683 A1\* 10/2017 Wei ..................... H03L 7/0814
2022/0115054 A1   4/2022 Kim

OTHER PUBLICATIONS

Korean Notice of Allowance; Application No., 10-2023-0048729; Dated Nov. 13, 2024.
Taiwan Office Action; Application No., 112110315; Dated Nov. 29, 2024.
Taiwan Notice of Allowance; Application No., 112110315; Dated Apr. 24, 2025.

\* cited by examiner

WORD LINE DELAY INTERLOCK CIRCUIT FOR WRITE OPERATION

CROSS-REFERENCE TO RELATED APPLICATIONS

The present application claims priority to U.S. Provisional Application No. 63/363,176, filed Apr. 18, 2022, U.S. Provisional Application No. 63/345,227, filed May 24, 2022, and U.S. Provisional Application No. 63/407,229, filed Sep. 16, 2022, the contents of which are incorporated by reference herein in their entireties.

BACKGROUND

Static random access memory (SRAM) devices are widely used for electronic applications where high speed and low power consumption are desired. SRAM devices are typically made up of one or more SRAM cells implemented using transistors.

BRIEF DESCRIPTION OF THE DRAWINGS

Aspects of the present disclosure are best understood from the following detailed description when read with the accompanying figures.

DETAILED DESCRIPTION

Figure 1:
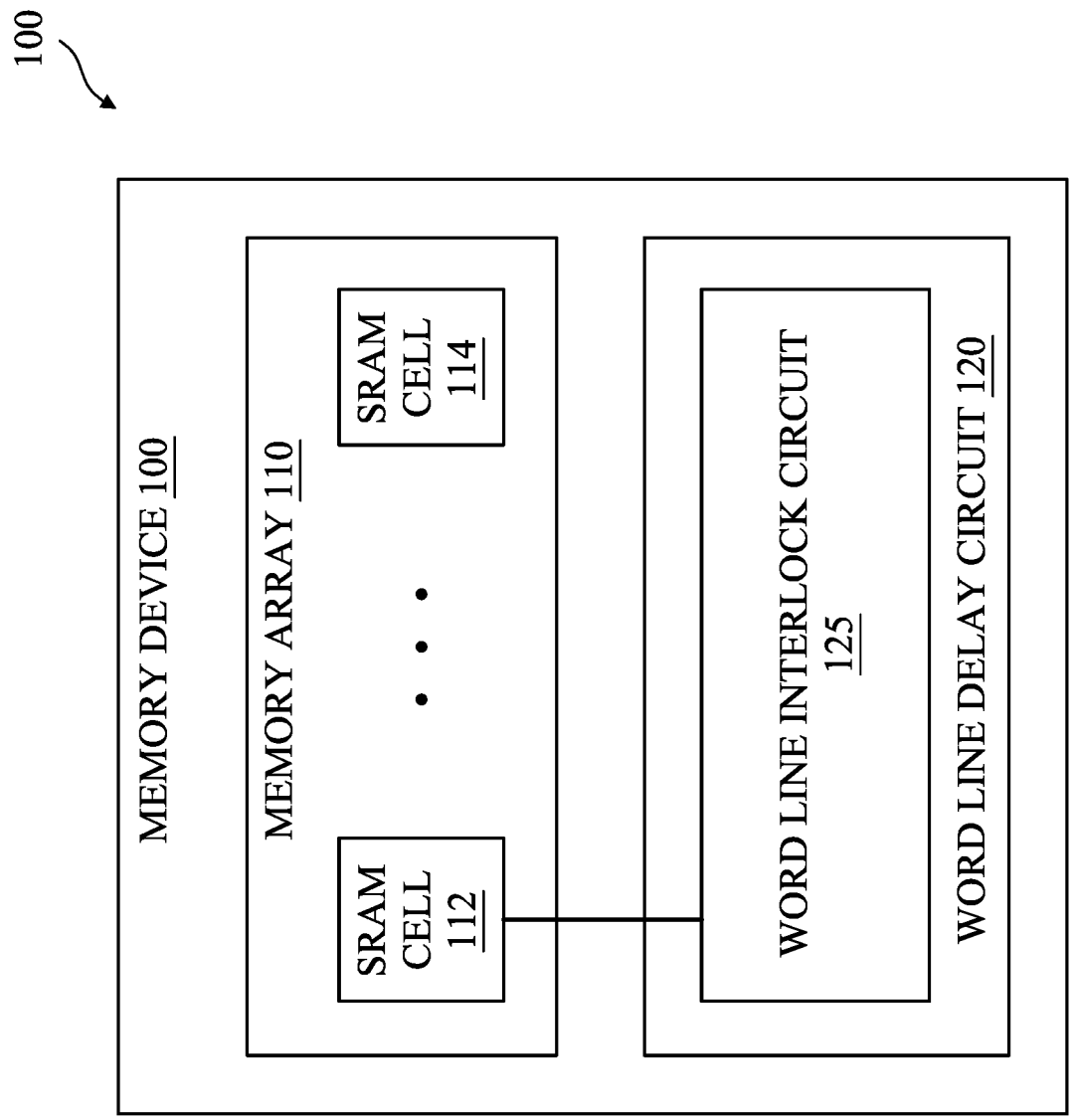
FIG. 1 is a block diagram illustrating an example memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

SRAM devices can be made up of one or more SRAM cells. SRAM cells can include different numbers of transistors. The transistors can form a data latch for storing a data bit. Additional transistors may be added to control the access to the transistors. SRAM cells can be arranged as an array having rows and columns. Typically, each row of the SRAM cells is connected to a word-line (WL), which determines whether the current SRAM cell is selected or not. Each column of the SRAM cells is connected to a bit-line (BL) or pair of BLs (BL/BLB), which is used for storing a data bit into a selected SRAM cell or reading a stored data bit from the selected SRAM cell.

SRAM cells perform reading and writing operations. The process of storing information in a SRAM cell is known as "writing." The process of reading information stored on the SRAM cell is known as "reading." Information for both read and write operations is transmitted in electronic pulses of logic highs (e.g., '1') and logic lows (e.g., '0'), represented by a square wave. When a pulse transitions between a logic high (e.g., '1') and a logic low (e.g., '0'), it is represented as an edge of the square wave. A pulse transitioning from a logic high (e.g., '1') to a logic low (e.g., '0') is known as a falling edge. A pulse transitioning from a logic low (e.g., '0') to a logic high (e.g., '1') is known as a rising edge. A pulse width is the measurement of time between a rising edge and a falling edge of the pulse. Throughout this description the terms pulse and signal may be used interchangeably.

A write operation in SRAMs requires the bit line (BL/BLB) to turn off before the word lines (WL/WLB) turn on. In other words, the falling edge of a bit line pulse should occur before the rising edge of the WL pulse. This timing is known as a WL margin. WL delay circuits can be used to control the WL margin by introducing a timing delay to modify the pulse width. The timing delay delays when the rising edge or falling edge occurs in time. This is used to ensure that write operations are successful (e.g., information is stored in the SRAM cell) that is that the WL stays on for the amount of time needed to store all the information into the SRAM cell. A write operation is also controlled by a reset signal (GCKPB). In some cases, however, the reset signal may stop a write operation before it is complete, causing write failures (e.g., information to not be stored within the SRAM cell as it needed more time to do so). This can happen because the WL delay causes the write operation to be delayed in time, which may happen at the same time the reset signal is received. This reset truncates or shrinks the WL pulse width. The subject matter described herein uses a WL interlock circuit that modifies a write pulse width in the WL delay circuit to facilitate successful write operations.

FIG. 1 is a block diagram illustrating an example memory device 100 in accordance with various embodiments of the present disclosure. The memory device 100 is formed of numerous electrical components and includes a memory array 110 and a word line (WL) delay circuit 120, among many other components such as those described in more detail in FIG. 2. The memory array 110 includes a number of memory cells (also referred to as bit cells) 112, 114 that are configured to store information in the form of a logic low (e.g., '0') or a logic high (e.g., '1'). As previously discussed, storage of this information in a bit cell is known as a write operation. Reading stored information from the bit cell is known as a read operation. The WL delay circuit 120 includes a WL interlock circuit 125. The WL interlock circuit 125 modifies a write pulse width in the WL delay circuit 120 to facilitate successful write operations, as described in more detail in FIG. 2.

Figure 2:
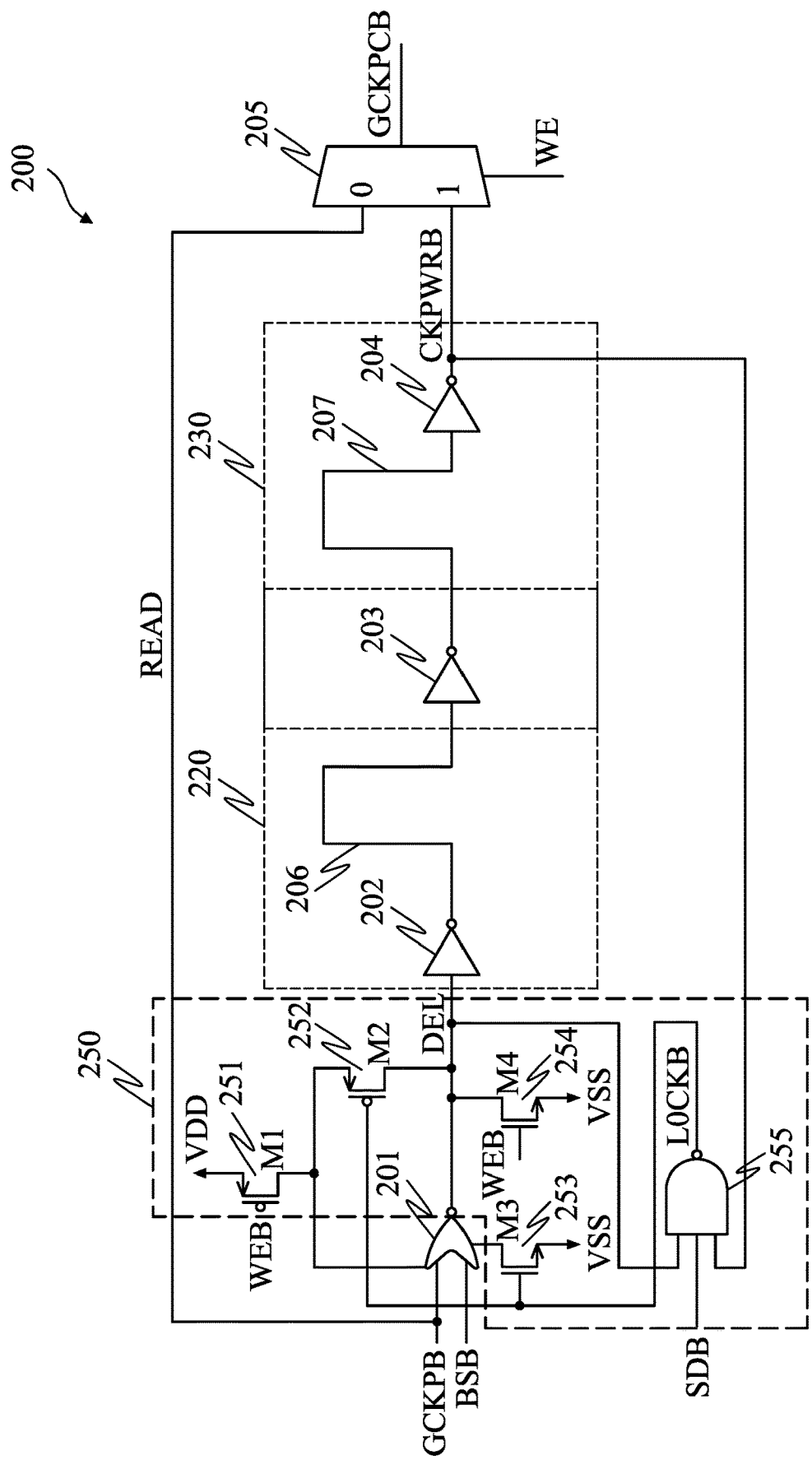
FIG. 2 is an electrical schematic illustrating an example WL delay circuit having a WL interlock circuit in accordance with various embodiments of the present disclosure.

FIG. 2 is an electrical schematic illustrating an example WL delay circuit 200 having a WL interlock circuit 250 in accordance with various embodiments of the present disclosure. WL interlock circuit 250 has two modes: a standby mode and a work mode. In standby mode, a read operation occurs and the WL interlock circuit 250 is inactive. In work mode, a write operation occurs and the WL interlock circuit 250 facilitates generation of a sufficient pulse width for the write operation by preventing pulse shrinkage. The pulse width generated using the WL interlock circuit 250 is described in more detail in FIG. 3. In both standby mode and work mode, the complementary shutdown (SDB) signal is a logic high (e.g., '1'), which enables operation of the WL delay circuit 200. When the complementary shutdown, SDB, signal is a logic low (e.g., '0'), the WL delay circuit 200 is non-operational (e.g., is shutdown for operation). Additionally, in both standby mode and work mode, the bank selection signal (BSB) is a logic low (e.g., '0').

WL interlock circuit 250 includes p-channel metal-oxide semiconductor (PMOS) transistors 251, 252, n-channel metal-oxide semiconductor (NMOS) transistors 253, 254, and a logic gate 255. For the purposes of illustration and ease of understanding, logic gate 255 is illustrated in FIG. 2 as a NAND gate. However, logic gate 255 can be any combination of logic gates that perform similar logic functions as a NAND gate such as an AND gate coupled to an inverter on its output. In addition to the WL interlock circuit 250, WL delay circuit 200 includes logic gate 201, inverters 202, 203, 204, multiplexer 205, and delay wires 206, 207. Delay wires 206, 207 further facilitate modification of a write pulse output by the WL delay circuit 200 by introducing a physical delay associated with electrical signals traveling the length of the delay wires 206, 207. In some embodiments, delay wires 206, 207 are not present, but the write pulse output by the corresponding WL delay circuits is still achieved by the various inverters in the respective WL delay circuits. For the purposes of illustration and ease of understanding, logic gate 201 is illustrated in FIG. 2 as a NOR gate. However, logic gate 201 can be any combination of logic gates that perform similar logic functions as a NOR gate such as an OR gate coupled to an inverter on its output.

Logic gate 201 receives a reset signal, GCKPB, and a bank selection, BSB, signal. A source/drain region of NMOS transistor 254 and a source/drain region of PMOS transistor 252 are coupled together and generate a delay, DEL, signal input to the logic gate 202. Source/drain regions may refer to a source or a drain, individually or collectively dependent upon the context. The delay, DEL, signal output from logic gate 201 is also the output of the WL interlock circuit 250. Another source/drain region of the PMOS transistor 252 is coupled to a source/drain region of PMOS transistor 251 as well as to a node of the logic gate 201. The connection of PMOS transistor 252 to a node of logic gate 201 facilitates control of operation of the logic gate 201. A gate region of PMOS transistor 252 is coupled to a complementary lock signal, LOCKB, output from logic gate 255. Another source/drain region of PMOS transistor 251 is coupled to a supply voltage, VDD. A gate region of PMOS transistor 251 is coupled to a complementary write enable, WEB, signal. A source/drain region of NMOS transistor 253 is coupled to a node of the logic gate 201 to facilitate control of the logic gate 201. Another source/drain region of NMOS transistor 253 is coupled to ground, VSS. Another source/drain region of NMOS transistor 254 is also coupled to ground, VSS. A gate region of NMOS transistor 254 is coupled to the complementary write enable, WEB, signal. In addition to the output signal of logic gate 201, logic gate 255 also receives a complementary shutdown signal, SDB, as well as a clock pulse width, CKPWRB, signal feedback from the output of inverter 204. Inverter 202 is coupled to an output of WL interlock circuit 250. An output of inverter 202 is coupled to a delay wire 206. Delay wire 206 is also coupled to an input of inverter 203. Another delay wire 207 is coupled to an output of inverter 203. Delay wire 207 is coupled to an input of inverter 204. An output of inverter 204, clock pulse width CKPWRB, is coupled to an input node of multiplexer 205. Multiplexer 205 also receives the reset signal, GCKPB. Multiplexer 205 is controlled via a write enable signal (WE). The coupling of inverters 202, 203, 204 via delay wires 206, 207 form delay loops 220, 230. In other words, a first delay loop 220 is formed by inverters 202, 203 and delay wire 206. A second delay loop 230 is formed by inverters 203, 204 and delay wire 207.

Operational PMOS or NMOS transistors act as closed switches, applying voltage from one of the source/drain regions. PMOS or NMOS transistors that are non-operational act as open switches and no voltage is applied from one of the source/drain regions. Generally speaking, PMOS transistors are in an "ON" state (e.g., operational) when the voltage applied at the gate region is a logic low (e.g., '0'). NMOS transistors are in an "ON" state (e.g., operational) when the voltage applied to the gate region is a logic high (e.g., '1').

A read operation occurs when multiplexer 205 selects the logic low (e.g., '0') input. This occurs when the write enable signal (WE) is a logic low (e.g., '0'). During a read operation, the WL interlock circuit 250 is in a standby mode. Logic gate 201 is not powered and therefore is disabled. The complementary write enable (WEB) is a logic high (e.g., '1'), which renders PMOS transistor 251 to be not operational (e.g., in an "OFF" state) and NMOS transistor 254 to be operational (e.g., in an "ON" state. The complementary shutdown signal (SDB) provided to logic gate 255 is a logic high (e.g., '1'). The clock pulse width signal (CKPWRB) output from inverter 204 is a logic high (e.g., '1') and the delay signal (DEL) is a logic low (e.g., '0'). Logic gate 255 compares the complementary shutdown signal (SDB) the clock pulse width signal (CKPWRB), and the delay signal. NAND gates output a logic high (e.g., '1') for any combination of three input signals, except when all three input signals are logic highs (e.g., '1'), then the NAND gate outputs a logic low (e.g., '0'). Therefore, in standby mode, logic gate 255 outputs a complementary lock signal, LOCKB, that is a logic high (e.g., '1'). With the complementary lock signal, LOCKB, as a logic high (e.g., '1'), NMOS transistor 253 is operational (e.g., in an "ON" state) and PMOS transistor 252 is not operational (e.g., in an "OFF" state). With both NMOS transistor 253 and NMOS transistor 254 in an operational state, the delay signal (DEL) is coupled to ground and is therefore a logic low (e.g., '0').

Inverter 202 inverts the delay signal (DEL) to a logic high (e.g., '1'), which travels along delay wire 206, an extra wire (e.g., a physical wire) to inverter 203. The delay wire 206 introduces a time delay in the signal due to the distance the signal output from inverter 202 travels to get to inverter 203. Inverter 203 inverts the logic high signal (e.g., '1') back to a logic low (e.g., '0'). That logic low signal (e.g., 0) travels along delay wire 207, an extra wire (e.g., a physical wire) to inverter 204. The delay wire 207 introduces a time delay in the signal due to the distance the signal output from inverter 203 to inverter 204. Inverter 204 inverts the logic low signal (e.g., '0') back to a logic high signal (e.g., '1'). In other words, the clock pulse width signal (CKPWRB) is a logic high (e.g., '1'), which is feedback to logic gate 255 as previously described. The write enable signal (WE) in standby mode is a logic low (e.g., '0')—opposite of the complementary write enable signal (WEB). With a logic low (e.g., '0') controlling the multiplexer 205, multiplexer 205 outputs a pulse signal (GCKPCB) that is the signal provided at the low (e.g., '0') node—the reset signal (GCKPB) which is set to a logic high (e.g., '1') in standby mode.

A write operation occurs when multiplexer 205 selects the logic high (e.g., '1') input. This occurs when the write enable signal (WE) is a logic high (e.g., '1'). During a write operation, the WL interlock circuit 250 is in a work mode. The logic gate 201 is powered by VDD in work mode. When the write enable signal (WE) is a logic high (e.g., '1'), the complementary write enable signal (WEB) is a logic low (e.g., '0'). With a logic low (e.g., '0') complementary write enable signal (WEB), PMOS transistor 251 is operational (e.g., in an "ON" state) and NMOS transistor 254 is non-operational (e.g., in an "OFF" state). When the reset signal (GCKPB) transitions from a logic high (e.g., '1') to a logic low (e.g., '0'), the delay signal (DEL) changes from a logic low (e.g., '0') to a logic high (e.g., '1') after one logic gate 201 delay. The complementary lock signal (LOCKB) is set to a logic low (e.g., '0') after one logic gate 201 delay. This occurs when all three inputs to logic gate 255—the complementary shutdown signal (SDB), the delay signal (DEL), and clock pulse width signal (CKPWRB)—are all logic highs (e.g., '1'). The complementary lock signal (LOCKB) being a logic low (e.g., '0') locks out operation of the WL delay circuit 200 until the clock pulse width signal (CKPWRB) transitions from a logic high (e.g., '1') to a logic low (e.g., '0'). When the complementary lock signal (LOCKB) is a logic low (e.g., '0'), NMOS transistor 253 is not operational (e.g., in an "OFF" state), which in turn disables (e.g., selectively operates) logic gate 201. The disabling of logic gate 201 prevents an edge of the reset signal, GCKPB, from coming into delay loops 220, 230. The delay signal (DEL) passes through the delay loops 220, 230 to generate the clock pulse width signal (CKPWRB). The complementary lock signal (LOCKB) is set to a logic high (e.g., '1') after the clock pulse width signal (CKPWRB) is changed from a logic high (e.g., '1') to a logic low (e.g., '0'). This is because the logic gate 255 outputs a logic high (e.g. '1') for any combination of inputs involving a logic low (e.g., '0').

The reset signal (GCKPB) resets when it transitions from a logic high (e.g., '1') to a logic low (e.g., '0') back to a logic high (e.g., '1'). Even if the reset signal (GCKPB) resets, the clock pulse width signal (CKPWRB) is not changed from a logic high (e.g. '1') to a logic low (e.g., '0') instantaneously due to delay loops 220, 230. The delay signal (DEL) changes from logic high (e.g., '1') to a logic low (e.g., '0') after one logic gate 201 delay, and then the complementary lock signal (LOCKB) is set to a logic high (e.g., '1') given that the signal propagation of the delay signal, DEL, is still in the delay loops 220, 230 at this time.

The WL interlock circuit 250 waits for the complementary lock signal, LOCKB, to become a logic high (e.g., '1') to let the reset signal (GCKPB) propagate through the rest of WL delay circuit 200. As previously discussed, the complementary lock signal, LOCKB, output from logic gate 255 is a logic high (e.g., '1') only when all of the inputs—the delay signal (DEL), the complementary shutdown signal (SDB) and the clock pulse width signal (CKPWRB) are all logic highs (e.g., '1'). The waiting of WL interlock circuit 250 reduces the need to keep WL pulse width wide, while protecting the WL pulse width of the pulse signal (GCKPCB) output by multiplexer 205. The WL pulse width is at a maximum given it is a function of the reset signal (GCKPB) pulse width and the write path delay introduced by delay loops 220, 230. Additionally, the write active power is reduced by over approximately 6-7% for big memory instances.

Figure 3:
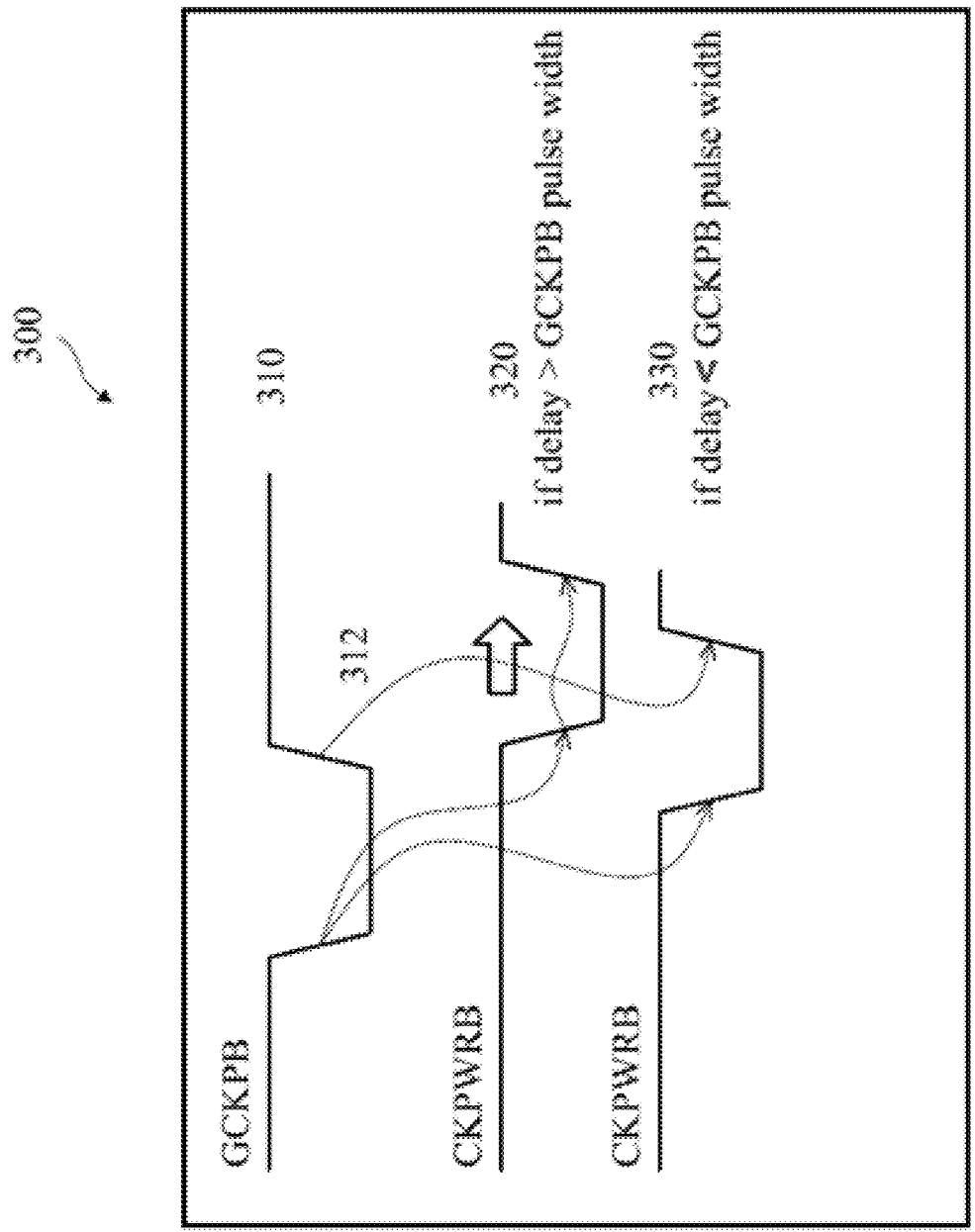
FIG. 3 is a graphical plot illustrating various input and outputs pulses of WL delay circuit while in work mode in accordance with various embodiments of the present disclosure.

FIG. 3 is a graphical plot 300 illustrating various input and outputs pulses of WL delay circuit 200 while in work mode in accordance with various embodiments of the present disclosure. Plot line 310 illustrates the reset signal (GCKPB) input into the logic gate 201 and multiplexer 205. Plot line 320 illustrates the clock pulse width signal (CKPWRB) if the delay introduced by delay loops 220, 230 is greater than the pulse width of the reset signal (GCKPB). Plot line 330 illustrates the clock pulse width signal (CKPWRB) if the delay introduced by delay loops 230, 240 is less than the pulse width of the reset signal (GCKPB). As illustrated by the plot line 320, 330, even when the rising edge of the reset signal (GCKPB) arrives before the delay completion as highlighted by line 312 of FIG. 3, the pulse width of the clock pulse width signal (CKPWRB) is maintained and does not shrink. This in turn facilitates successful write operations by avoiding failures.

Figure 4:
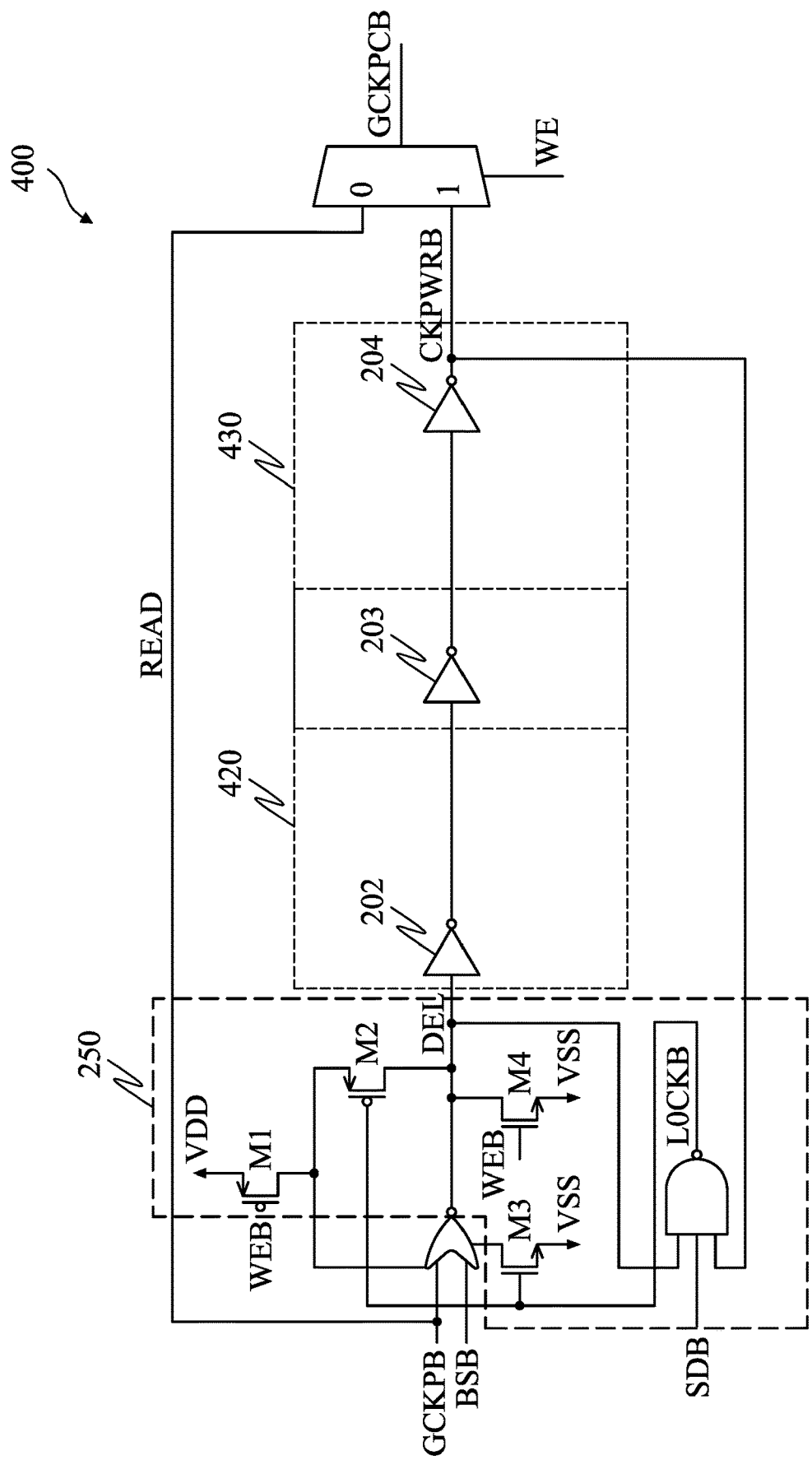
FIG. 4 is an electrical schematic illustrating another example WL delay circuit having a WL interlock circuit in accordance with various embodiments of the present disclosure.

FIG. 4 is an electrical schematic illustrating another example WL delay circuit 400 having a WL interlock circuit 250 in accordance with various embodiments of the present disclosure. WL delay circuit 400 is similar in operation and makeup to WL delay circuit 200, except that WL delay circuit 400 includes delay loops 420, 430 that do not include delay wires. In other words, delay loop 420 is formed by inverters 202, 203 and delay loop 430 is formed by inverters 203, 204. Delay loop 420 does not include delay wire 206 and delay loop 430 does not include delay wire 207. All other components and functionality described in FIG. 2 remain the same.

Figure 5:
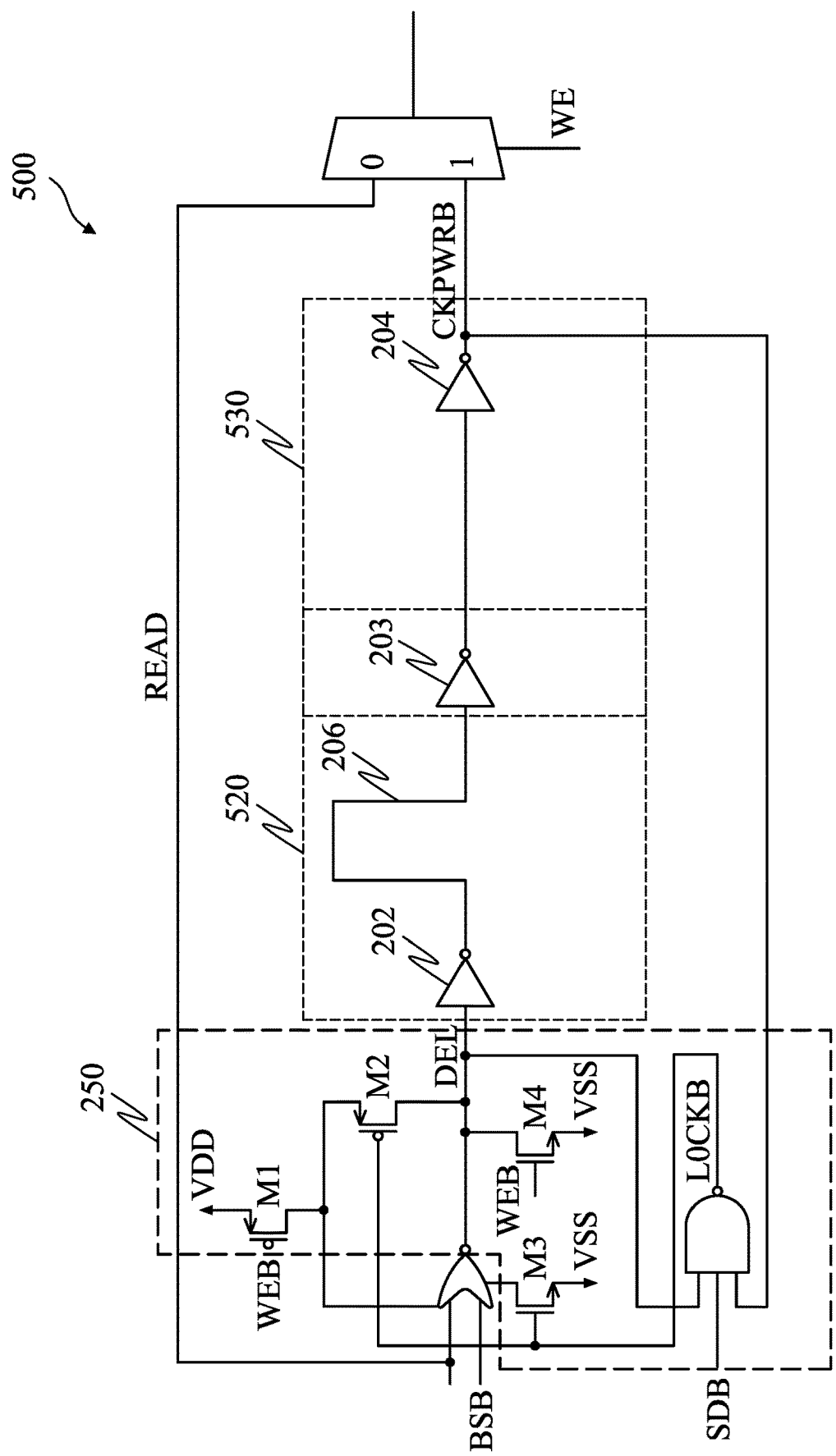
FIG. 5 is an electrical schematic illustrating another example WL delay circuit having a WL interlock circuit in accordance with various embodiments of the present disclosure.

FIG. 5 is an electrical schematic illustrating another example WL delay circuit 500 having a WL interlock circuit 250 in accordance with various embodiments of the present disclosure. WL delay circuit 500 is similar in operation and makeup to WL delay circuit 200, except that WL delay circuit 500 includes delay loops 520, 530, only one of which includes a delay wire 206. In other words, delay loop 520 is formed by inverters 202, 203 and delay loop 530 is formed by inverters 203, 204. Delay loop 520 does include delay wire 206. However, delay loop 530 does not include delay wire 207. All other components and functionality described in FIG. 2 remain the same.

Figure 6:
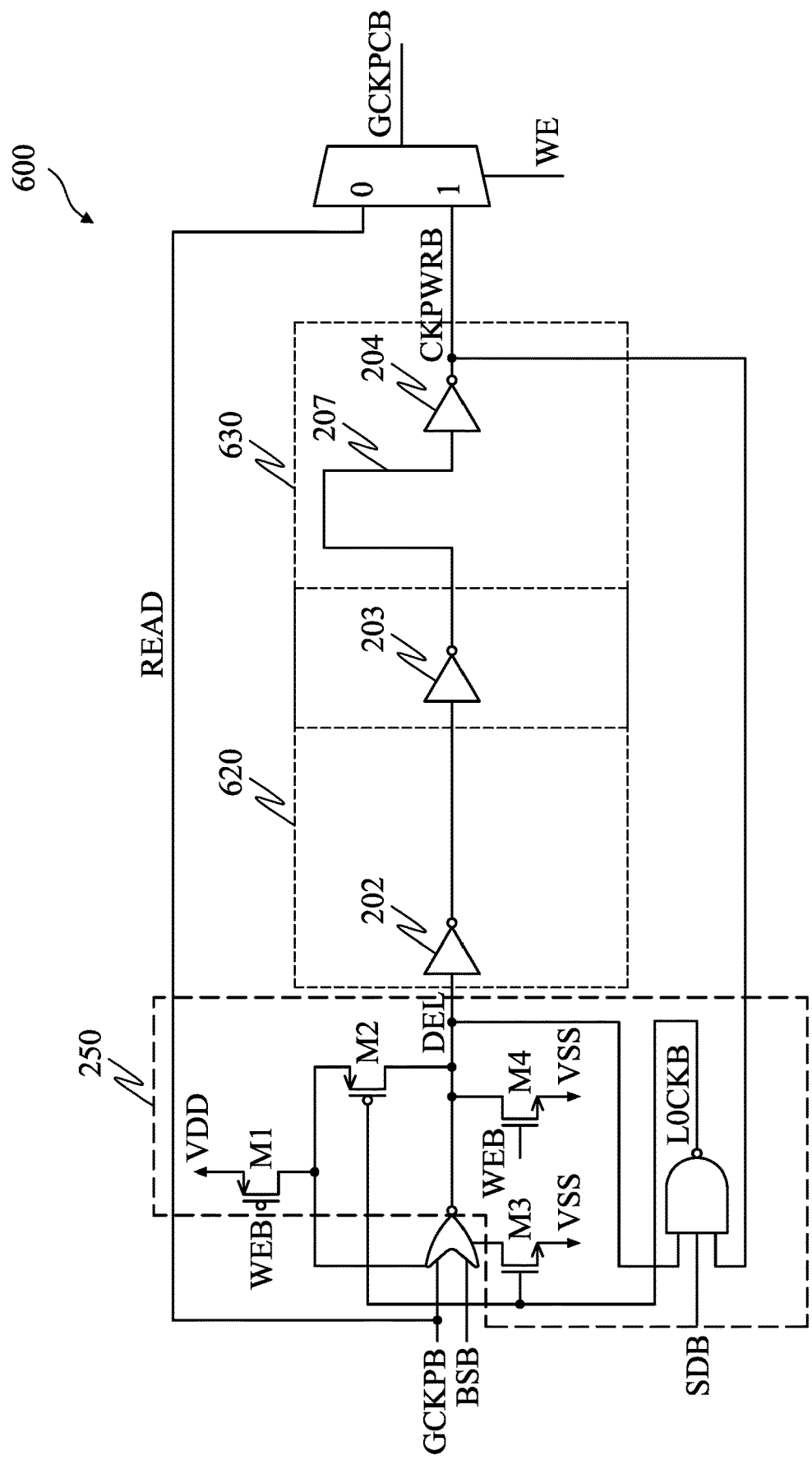
FIG. 6 is an electrical schematic illustrating another example WL delay circuit having a WL interlock circuit in accordance with various embodiments of the present disclosure.

FIG. 6 is an electrical schematic illustrating another example WL delay circuit 600 having a WL interlock circuit 250 in accordance with various embodiments of the present disclosure. WL delay circuit 500 is similar in operation and makeup to WL delay circuit 200, except that WL delay circuit 600 includes delay loops 620, 630, only one of which includes a delay wire 207. In other words, delay loop 620 is formed by inverters 202, 203 and delay loop 630 is formed by inverters 203, 204. Delay loop 620 does not include delay wire 206. However, delay loop 630 does include delay wire 207. All other components and functionality described in FIG. 2 remain the same.

Figure 7:
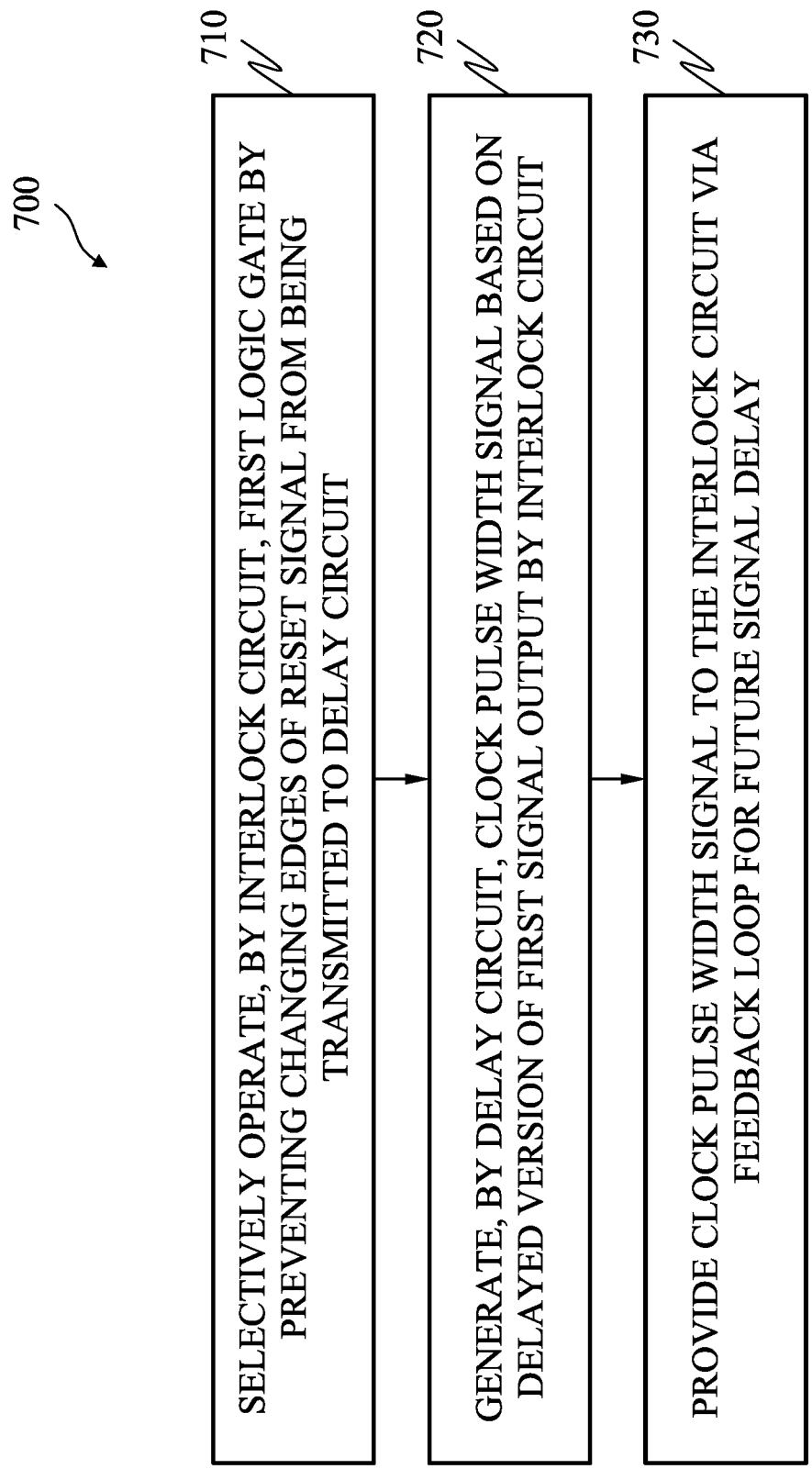
FIG. 7 is a process flow diagram illustrating a method of generating a clock pulse width signal in accordance with various embodiments of the present disclosure.

FIG. 7 is a process flow diagram 700 illustrating a method of generating a clock pulse width signal in accordance with various embodiments of the present disclosure. While FIG. 7 is described here with reference to previously described structures for ease in understanding, it is understood that the method applies to many other structures as well. An interlock circuit 250 selectively operates, at step 710, a first logic gate 201 by preventing changing edges of a reset signal from being transmitted to a delay circuit (e.g., delay loops 220, 230). The delay circuit (e.g., delay loops 220, 230) generates, at step 720, a clock pulse width signal (CKPWRB) based on a delayed version of first signal output by the interlock circuit 250 (e.g., delay signal DEL). The clock pulse width signal (CKPWRB) is provided, at step 730, to the interlock circuit 250 (e.g., to logic gate 255) via a feedback loop (e.g., output from logic gate 204 to input of logic gate 255) for future signal delay.

Use of the various systems, circuits, and methods as described herein can provide a number of advantages. For example, use of the subject matter described herein can provide a sufficient write pulse width for write operations of a SRAM cell by preventing pulse shrinkage. Additionally, use of the WL interlock circuit can help reduce write active power for big memory instances.

In one embodiment, a device includes a first logic gate, an interlock circuit, and a delay circuit. The first logic gate is configured to receive a reset signal. The interlock circuit is coupled to an output of the first logic gate. The interlock circuit is configured to generate a first signal and selectively operate the first logic gate. The delay circuit is coupled to an output of the interlock circuit. The delay circuit is configured to receive the first signal from the interlock circuit and delay the first signal to generate a clock pulse width signal that is fed back to the interlock circuit. In response to the reset signal changing logic states, the selective operation of the first logic gate prevents changing edges of the reset signal from being transmitted to the delay circuit.

In another embodiment, a method of generating a clock pulse width signal includes selectively operating, by an interlock circuit, a first logic gate by preventing changing edges of a reset signal from being transmitted to a delay circuit. The delay circuit generates a clock pulse width signal based on a delayed version of first signal output by the interlock circuit. The clock pulse width signal is provided to the interlock circuit via a feedback loop for future signal delay.

In yet another embodiment, a system includes an SRAM device and a word line driver circuit. The SRAM device includes a plurality of cells coupled together via a word line. The SRAM device is configured to perform a write operation to store information in one or more of the plurality of cells. The word line driver circuit includes an interlock circuit and a delay circuit. The interlock circuit is configured to generate an interlock signal and selectively operate a logic gate to prevent changing edges of a reset signal from being transmitted to a delay circuit. The delay circuit is coupled to an output of the interlock circuit and is configured to generate a clock pulse width signal based on the interlock signal that is fed back to the interlock circuit and provided to the word line to facilitate the write operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
 a first logic gate configured to receive a reset signal;
 an interlock circuit coupled to an output of the first logic gate, the interlock circuit configured to generate a first signal and selectively operate the first logic gate; and
 a delay circuit coupled to an output of the interlock circuit, the delay circuit configured to receive the first signal from the interlock circuit and delay the first signal to generate a clock pulse width signal that is fed back to the interlock circuit,
 wherein in response to the reset signal changing logic states, the selective operation of the first logic gate prevents changing edges of the reset signal from being transmitted to the delay circuit, and the interlock circuit comprises a second logic gate configured to receive the first signal and the clock pulse width signal.

2. The device of claim 1, wherein a pulse width of the first signal is maintained independent of the reset signal due to the operation of the first logic gate being temporarily halted.

3. The device of claim 1, wherein the clock pulse width signal is provided to a word line of a memory device in response to a write enable signal being in a high-logic state.

4. The device of claim 1, wherein the changing logic states of the reset signal comprises changing from a high-logic state to a low-logic state.

5. The device of claim 1, wherein the delay circuit comprises a first delay loop comprising a first inverter and a second inverter coupled together in series and a second delay loop coupled to an output of the first delay loop, the second delay loop comprising the second inverter and a third inverter coupled in series.

6. The device of claim 5, wherein a first delay wire is disposed between the first inverter and the second inverter, and a second delay wire is disposed between the second inverter and the third inverter.

7. The device of claim 5, wherein a first delay wire is disposed between the first inverter and the second inverter or between the second inverter and the third inverter.

8. The device of claim 1, wherein the interlock circuit comprises:
 a first transistor comprising a first gate region, a first source/drain region, and a second source/drain region, wherein the first transistor is configured to receive a complementary write enable signal at the first gate region and a supply voltage at the first source/drain region, wherein the second source/drain region is coupled to a first node of the first logic gate;
 a second transistor comprising a second gate region, a third source/drain region, and a fourth source/drain region, wherein the third source/drain region of the second transistor is coupled to the second source/drain region of the first transistor, the fourth source/drain region is coupled to an output of the first logic gate, and wherein the second transistor is configured to receive a lock signal at the second gate region;

a third transistor comprising a third gate region, a fifth source/drain region, and a sixth source/drain region, wherein the third gate region of the third transistor is coupled to the lock signal, and wherein the fifth source/drain region is coupled to the first logic gate at a second node, and the sixth source/drain region is coupled to ground;

a fourth transistor comprising a fourth gate region, a seventh source/drain region, and an eighth source/drain region, wherein the fourth transistor is configured to receive the complementary write enable signal at the fourth gate region, and wherein the seventh source/drain region is coupled to the output of the first logic gate and the eighth source/drain region is coupled to ground; and the second logic gate coupled to the second transistor and the third transistor, the second logic gate configured to compare the first signal, a shutdown signal, and the clock pulse width signal to generate the lock signal.

9. The device of claim 1, wherein the second logic gate is a NAND gate and the first logic gate is a NOR gate.

10. The device of claim 5, further comprising a multiplexer coupled to an output of the third inverter and configured to receive the reset signal, wherein the multiplexer is configured to output either the clock pulse width signal or the reset signal based on the write enable signal.

11. A method of generating a clock pulse width signal, the method comprising:
selectively operating, by an interlock circuit, a first logic gate by preventing changing edges of a reset signal from being transmitted to a delay circuit;
generating, by the delay circuit, a clock pulse width signal based on a delayed version of a first signal output by the interlock circuit;
providing the clock pulse width signal to the interlock circuit via a feedback loop for future signal delay; and
providing the clock pulse width signal in response to a write enable signal.

12. The method of claim 11, wherein a pulse width of the first signal is maintained independent of the reset signal due to the operation of the first logic gate being temporarily halted.

13. The method of claim 11, wherein providing the clock pulse width signal comprises:
providing, by a multiplexer, the clock pulse width signal to a word line of a memory device in response to the write enable signal being in a high-logic state.

14. The method of claim 11, wherein the changing logic states of the reset signal comprises changing from a high-logic state to a low-logic state.

15. The method of claim 11, wherein the delay circuit comprises a first delay loop comprising a first inverter and a second inverter coupled together in series and a second delay loop coupled to an output of the first delay loop, the second delay loop comprising the second inverter and a third inverter coupled in series.

16. The method of claim 15, wherein a first delay wire is disposed between the first inverter and the second inverter, and a second delay wire is disposed between the second inverter and the third inverter.

17. The method of claim 15, wherein a first delay wire is disposed between the first inverter and the second inverter or between the second inverter and the third inverter.

18. The method of claim 11, further comprising:
receiving, by a first transistor comprising a first gate region, a first source/drain region, and a second source/drain region, a complementary write enable signal at the first gate region and a supply voltage at the first source/drain region, wherein the second source/drain region is coupled to a first node of the first logic gate;
receiving, by a second transistor comprising a second gate region, a third source/drain region, and a fourth source/drain region, a lock signal at the second gate region, wherein the third source/drain region of the second transistor is coupled to the second source/drain region of the first transistor, the fourth source/drain region is coupled to an output of the first logic gate;
selectively operating, by the second transistor or a third transistor comprising a third gate region, a fifth source/drain region, and a sixth source/drain region, wherein the third gate region of the third transistor is coupled to the lock signal, and wherein the fifth source/drain region is coupled to the first logic gate at a second node, and the sixth source/drain region is coupled to ground;
receiving, by a fourth transistor comprising a fourth gate region, a seventh source/drain region, and an eighth source/drain region, the complementary write enable signal at the fourth gate region, wherein the seventh source/drain region is coupled to the output of the first logic gate and the eighth source/drain region is coupled to ground; and
comparing, by a second logic gate coupled to the second transistor and the third transistor, the first signal, a shutdown signal, and the clock pulse width signal to generate the lock signal.

19. The method of claim 18, wherein the second logic gate is a NAND gate and the first logic gate is a NOR gate.

20. A system comprising:
a static random access memory (SRAM) device comprising a plurality of cells coupled together via a word line, the SRAM device configured to perform a write operation to store information in one or more of the plurality of cells; and
a word line driver circuit comprising:
an interlock circuit configured to generate an interlock signal and selectively operate a logic gate to prevent changing edges of a reset signal from being transmitted to a delay circuit; and
the delay circuit coupled to an output of the interlock circuit, the delay circuit configured to generate a clock pulse width signal based on the interlock signal that is fed back to the interlock circuit and provided to the word line to facilitate the write operation.

* * * * *